United States Patent
Jang et al.

(10) Patent No.: US 8,899,174 B2
(45) Date of Patent: Dec. 2, 2014

(54) DEVICE AND METHOD FOR FABRICATING DISPLAY DEVICE

(75) Inventors: Won-Hyouk Jang, Yongin (KR);
Eu-Gene Kang, Yongin (KR); Joo-Hwa Lee, Yongin (KR); Min-Jeong Hwang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 562 days.

(21) Appl. No.: 12/896,496

(22) Filed: Oct. 1, 2010

(65) Prior Publication Data
US 2011/0189380 A1 Aug. 4, 2011

(30) Foreign Application Priority Data
Feb. 2, 2010 (KR) ........................ 10-2010-0009718

(51) Int. Cl.
| | |
|---|---|
| *C23C 16/52* | (2006.01) |
| *C23C 16/448* | (2006.01) |
| *C23C 16/44* | (2006.01) |
| *C23C 16/00* | (2006.01) |
| *B05C 11/00* | (2006.01) |

(52) U.S. Cl.
CPC ................. *C23C 16/00* (2013.01); *B05C 11/00* (2013.01); *C23C 16/52* (2013.01); *C23C 16/44* (2013.01); *C23C 16/448* (2013.01)
USPC ............ 118/665; 118/726; 118/715; 118/663

(58) Field of Classification Search
None
See application file for complete search history.

(56) References Cited

U.S. PATENT DOCUMENTS

| | | | | |
|---|---|---|---|---|
| 4,627,989 A | * | 12/1986 | Feuerstein et al. | ............... 427/10 |
| 6,040,939 A | * | 3/2000 | Demiryont et al. | ........... 359/360 |
| 6,060,826 A | * | 5/2000 | Ueda et al. | ..................... 313/498 |
| 2002/0153360 A1 | * | 10/2002 | Yamazaki et al. | ....... 219/121.66 |
| 2003/0136772 A1 | * | 7/2003 | Yamazaki et al. | ........ 219/121.73 |
| 2004/0132266 A1 | * | 7/2004 | Yamazaki et al. | ............. 438/478 |
| 2005/0277028 A1 | * | 12/2005 | Yamazaki et al. | ................ 430/4 |
| 2007/0221131 A1 | * | 9/2007 | Yoshikawa et al. | ........... 118/726 |
| 2008/0098957 A1 | * | 5/2008 | Ryu et al. | ...................... 118/712 |
| 2010/0086681 A1 | | 4/2010 | Ikuta et al. | |

FOREIGN PATENT DOCUMENTS

| | | |
|---|---|---|
| JP | 2004-225058 | 8/2004 |
| KR | 1020050051138 | 6/2005 |
| KR | 10-2006-0080679 | 7/2006 |

(Continued)

*Primary Examiner* — Dah-Wei D Yuan
*Assistant Examiner* — Jethro Pence
(74) *Attorney, Agent, or Firm* — Robert E. Bushnell, Esq.

(57) ABSTRACT

A device for manufacturing a display device includes a deposition source; a deposition thickness calculator for calculating a deposition thickness of a deposition material deposited on a substrate; and a controller for controlling a power of a heater which heats the deposition source by comparing the deposition thickness calculated with a reference thickness. The controller controls the power of the heater either at least one time for each substrate on which the thin film is to be deposited or at regular intervals while the deposition material is deposited. Influence of measurement noise that is included in a quartz crystal sensor for measuring a deposition speed may be minimized, and distribution of deposition thickness of an organic light emitting material may be reduced, thereby increasing the yield of the deposition process and producing quality display devices.

3 Claims, 10 Drawing Sheets

(56) References Cited

FOREIGN PATENT DOCUMENTS

| KR | 10-2008-0002189 | | 1/2008 | |
| KR | 10-2008-0038671 | | 5/2008 | |
| KR | 1020080046954 | | 5/2008 | |
| KR | 10-2008-0062168 | | 7/2008 | |
| KR | 2008-0062168 | * | 7/2008 | ................ G02F 1/13 |
| KR | 1020080081684 | | 9/2008 | |

* cited by examiner

DEVICE AND METHOD FOR FABRICATING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on Feb. 2, 2010 and there duly assigned Serial No. 10-2010-0009718.

BACKGROUND OF THE INVENTION

1. Field of the Invention

Embodiments of the present invention relate to a device and method for fabricating a display device, more particularly, to a device and method for manufacturing a display device, for increasing a yield of a deposition process for generating a thin film on a substrate of a display device, and for generating a display device with higher quality.

2. Description of the Related Art

Various flat panel display devices have been developed, and the flat panel display devices have reduced volume and weight compared to display devices having cathode ray tubes. The flat panel displays include a liquid crystal display (LCD), a field emission display, a plasma display panel (PDP), and an electro-luminescence display device.

The above information disclosed in this Background section is only for enhancement of understanding of the background of the invention and therefore may contain information that does not form prior art that is already known in this country to a person of ordinary skill in the art.

SUMMARY OF THE INVENTION

The embodiments of the present invention have been made in an effort to provide a device and method for manufacturing a display device for generating a quality display device by increasing the yield of a deposition process for generating a thin film on a substrate of the display device.

An exemplary embodiment of the present invention provides a device for manufacturing a display device, including a deposition source; a deposition thickness calculator for calculating deposition thickness of a deposition material deposited on a substrate from the deposition source; and a controller for controlling power of a heater for heating the deposition source by comparing the calculated deposition thickness with a reference thickness. The controller may control power of the heater once when each substrate is loaded into a deposition chamber. The controller may control power at regular intervals during which the deposition material is deposited.

The device may further include a deposition speed measuring sensor for measuring a vapor volume of a deposition material that is sublimated from the deposition source and fills a deposition chamber.

The deposition speed measuring sensor may be a quartz crystal sensor.

The device may further include a deposition rate calculator for calculating a deposition speed of a deposition material by using the measured vapor volume of the deposition material.

The deposition thickness calculator may calculate a deposition thickness of the deposition material by integrating the deposition speed of the deposition material with respect to time.

The device may further include a deposition thickness measurer for irradiating light onto a pattern of a thin film that is deposited on the substrate, receiving light reflected from the pattern of the thin film, and measuring a polarization state of the reflected light.

The deposition thickness measurer may be an ellipsometer.

The deposition thickness measurer may include a photo-irradiator for irradiating light onto the pattern of the thin film that is deposited on the substrate, and a photo-receiver for receiving the reflected light and for measuring the polarization state of the reflected light.

The photo-irradiator may irradiate light onto the pattern of the thin film at regular intervals during which the deposition material is deposited on the substrate.

The deposition thickness calculator may calculate deposition thickness from the measured polarization state of the reflected light.

Another embodiment of the present invention provides a method for manufacturing a display device, including steps of loading a substrate into a deposition chamber; forming a thin film by depositing a deposition material on the substrate; measuring a deposition speed for depositing the deposition material; calculating deposition thickness by integrating the deposition speed with respect to time; and controlling power of a deposition source heater by comparing the deposition thickness calculated with a reference thickness.

Power of the deposition source heater may be controlled each time when a deposition process in which the substrate is loaded into the deposition chamber to form a thin film is performed.

The step of measuring of the deposition speed may include steps of measuring a vapor volume of the deposition material by using a resonant frequency of a quartz crystal, and calculating the deposition speed of the deposition material by using the measured vapor volume of the deposition material.

Yet another embodiment of the present invention provides a method for manufacturing a display device, including steps of loading a substrate into a deposition chamber; forming a thin film by depositing a deposition material on the substrate; measuring deposition thickness at regular intervals during which the deposition material is deposited; and controlling power of a deposition source heater by comparing the deposition thickness with a reference thickness.

The measuring of the deposition thickness includes steps of periodically irradiating light onto a random pattern of the thin film; measuring a polarization state of the light reflected from the random pattern of the thin film; and calculating the deposition thickness from the polarization state.

In accordance with an embodiment of the present invention, influence of measurement noise that is included in a quartz crystal sensor for measuring a deposition speed may be minimized, and distribution of deposition thickness of an organic light emitting material may be reduced, thereby increasing the yield of the deposition process and producing display devices with higher quality.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
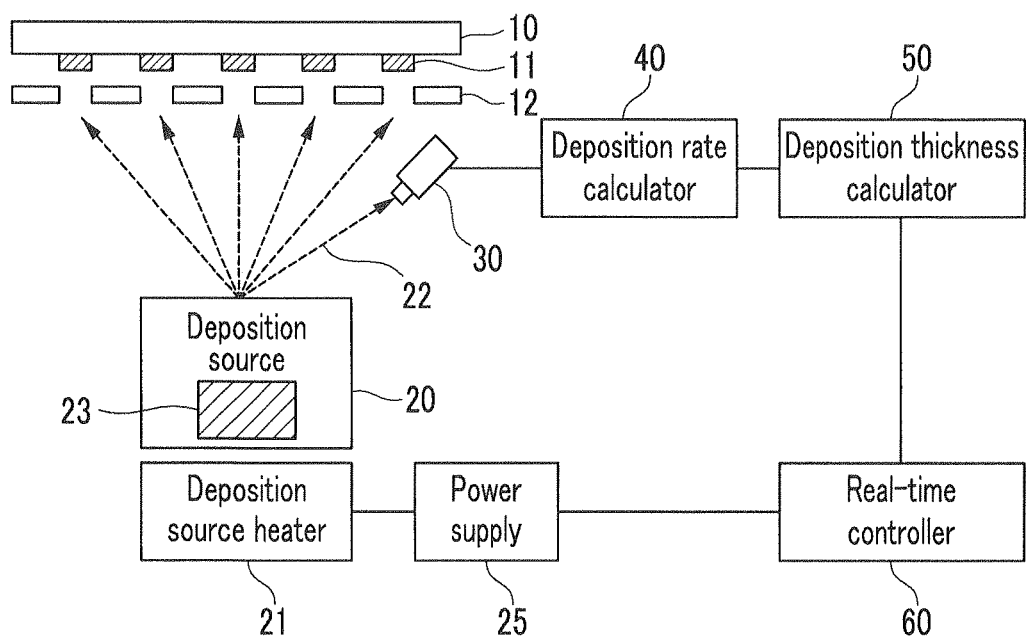
FIG. 1 is a block diagram of a device for manufacturing a display device construct as the principle of an exemplary embodiment of the present invention.

The present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

Furthermore, constituent elements having the same configurations in the exemplary embodiments are exemplarily described in a first exemplary embodiment using like reference numerals, and only configurations different from those in the first exemplary embodiment will be described in other exemplary embodiments. In addition, like reference numerals designate like elements throughout the specification and drawings.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

A plurality of thin films included in the flat panel displays may be formed by a deposition process. Upon the completion of the deposition process, each of thin films may be measured to determine whether the each of the thin films is formed to have a predetermined reference thickness, and a deposition ratio may be corrected if the actual thickness is different from the predetermined reference thickness.

More specifically, a deposition material received in a deposition vessel may be heated to become in form of vapor in a sublimation state, the deposition material in form of vapor is absorbed by a substrate surface, and deposition absorbed is formed as a thin film on the substrate. In this instance, a quartz crystal sensor may measure the actual deposition speed of the deposition material that is received by the deposition vessel, heated, changed into a vapor form in the sublimation state, and vaporized.

The actual deposition speed measured by the quartz crystal sensor may be compared with a predetermined deposition speed. The actual thickness of the thin film formed on the deposited substrate may be also compared with the predetermined reference thickness. When the actual thickness is different from the predetermined reference thickness, the deposition ratio may be corrected.

Accordingly, the actual thickness of the thin film may be indirectly checked by using the quartz crystal sensor instead of directly measuring the actual thickness of the thin film formed on the substrate. The quartz crystal sensor may include a measurement noise as time passes, because, for example, the resonant frequency of the quartz crystal sensor may change due to the measurement noise as time passes.

Also, in order to correct the deposition ratio, power of a heater for heating the deposition vessel may be controlled by a PID (proportional integral derivative) controller. The PID controller is a generic control loop feedback controller used in industrial control systems. In a proportional integral derivative control method, the response performance may be worsened by disturbance. The PID control method compares a deviation for an abrupt disturbance. When a large deviation occurs, the PID control method increases a manipulated variable to quickly reach the target value. When power of the heater is controlled by the PID control method, power of the heater may be substantially changed, and performance of devices may be degraded.

A configuration and operation of a device for manufacturing a display device constructed as the principle of an exemplary embodiment of the present invention will now be described.

Figure 2A:
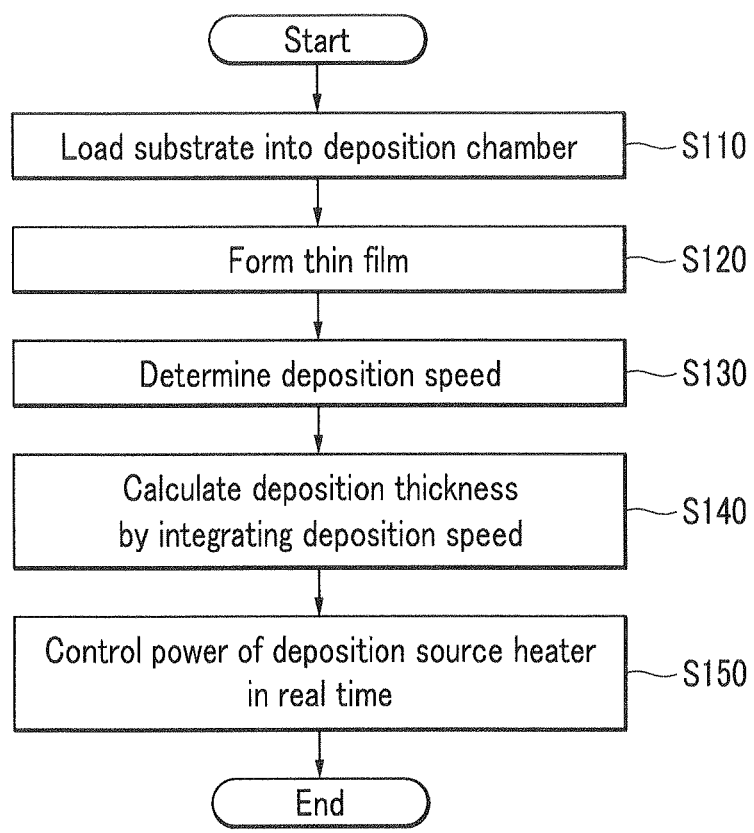
FIGS. 2A and 2B are flowcharts of methods for manufacturing a display device construct as the principle of an exemplary embodiment of the present invention.
Figure 2B:
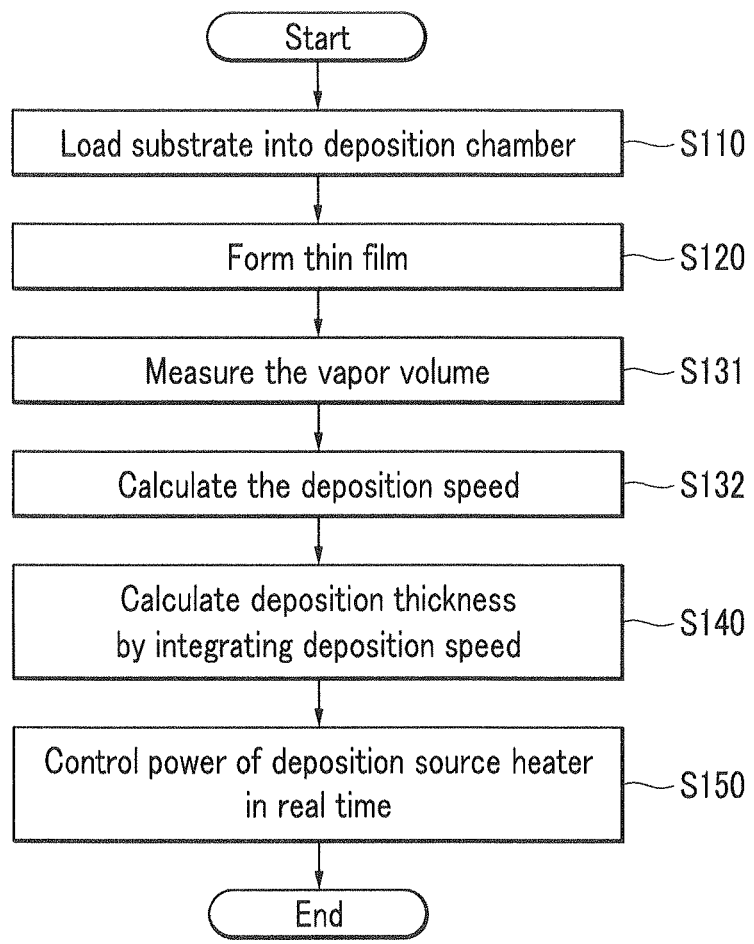

FIG. 1 is a block diagram of a device for manufacturing a display device constructed as the principle of an exemplary embodiment of the present invention, and FIGS. 2A and 2B are flowcharts of methods for manufacturing a display device constructed as the principle of an exemplary embodiment of the present invention.

Referring to FIG. 1, the display device manufacturing device includes a deposition source 20, a deposition speed measuring sensor 30, a deposition rate calculator 40, a deposition thickness calculator 50, and a real-time controller 60.

The deposition source 20 includes a deposition material 23, and the deposition source 20 is connected to a deposition chamber (not shown) in which the deposition process is performed. The deposition material that is formed as an organic thin film layer of an organic light emitting element includes a hole injection material, a hole transport material, a light emitting material, an electron transport material, and an electron injection material.

The hole injection material helps easy injection of holes from an anode, and copper phthalocyanine (CuPc) or PEDOT is generally used. The hole transport material easily carries the holes and binds the electrons in the light emitting area in order to increase the exciton formation possibility, and an amine for stabilizing positive ion radicals is used.

The electron transport material represents a compound that has electron withdrawers for stabilizing the negative ion radicals generated when electrons are injected from a cathode, or a metallic compound for receiving the electrons. The compounds including a functional group withdrawing the electrons by resonance include a cyano group, an oxadiazole, or a triazole, and the compound such as Alq3 (Al(C9H6NO)3) may be used. The electron injection material represents a metal compound having electron affinity to control the electrons to be fluently injected from the cathode.

The light emitting material may emit three primary colors of red, green, and blue. The blue light emitting material may use anthracene, phenyl-replaced cyclopentadiene, and DVPBi. The green light emitting material may use Alq3, and the red light emitting material may use perylene.

A deposition source heater 21 is provided close to the deposition source 20, and the deposition source heater 21 sublimates the deposition material by heating the deposition source 20. The deposition source heater 21 is electrically connected to a power supply 25, and the power supply 25 supplies power to the deposition source heater 21.

The deposition speed measuring sensor 30 is provided in the deposition chamber, and measures a vapor volume 22 of the sublimated deposition material of the deposition source 20. The deposition speed is in proportion to the vapor volume 22 of the deposition material filling the deposition chamber. That is, the deposition speed may be calculated by measuring the vapor volume 22 of the deposition material in the deposition chamber. The quartz crystal sensor may be used as the deposition speed measuring sensor 30.

The deposition rate calculator 40 is connected to the deposition speed measuring sensor 30, and calculates the deposition speed by using the measured vapor volume 22 of the deposition material.

The deposition thickness calculator 50 is connected to the deposition rate calculator 40, and calculates the deposition thickness by integrating the deposition speed of the calculated deposition material.

The real-time controller 60 is connected to the deposition thickness calculator 50, and controls the amount of power supplied by the power supply 25 of the deposition source heater 21 by comparing the calculated deposition thickness with a reference thickness.

A method for manufacturing a display device using a device for generating the above-described display device will now be described.

Referring to FIGS. 1, 2A and 2B, the substrate 10 is loaded into the deposition chamber (S110).

When the substrate 10 is loaded in the deposition chamber, the deposition material that is sublimated from the deposition source 20 passes through a mask 12 and the deposition material is deposited on a substrate 10 to form a thin film 11 (S120).

When the deposition material is deposited on the substrate 10 to form the thin film 11, the deposition speed is determined by the deposition speed measuring sensor 30 and the deposition rate calculator 40 (S130).

In one embodiment as shown in FIG. 2B, the deposition speed measuring sensor 30 measures the vapor volume 22 of the deposition material in the deposition chamber (S131), and the deposition rate calculator 40 calculates the deposition speed of the deposition material by using the vapor volume 22 of the deposition material measured by the deposition speed measuring sensor 30 (S132).

When the quartz crystal sensor is adopted as the deposition speed measuring sensor 30, the quartz crystal sensor measures the resonant frequency of the quartz crystal when the quartz crystal vibrates at several MHz by an oscillator (not shown). The vapor volume 22 of the deposition material may be measured from the resonant frequency of the quartz crystal. The deposition rate calculator 40 may calculate the deposition speed of the deposition material, in consideration of the type of deposition material, density, and other characteristics. The deposition rate calculator 40 transmits the calculated deposition speed to the deposition thickness calculator 50.

The deposition thickness calculator 50 integrates the deposition speed calculated by the deposition rate calculator 40 with respect to time in order to calculate the actual deposition thickness of the deposited thin film 11, that is, the actual thickness of the deposition material deposited on the substrate 10 (S140). The deposition thickness calculator 50 transmits the calculated deposition thickness of the deposition material to the real-time controller 60.

The real-time controller 60 controls power of the deposition source heater 21 by comparing the calculated deposition thickness with a reference thickness (S150). The real-time controller 60 includes the reference thickness of the thin film 11. The real-time controller 60 compares the actual deposition thickness calculated from measurement of the deposition speed with the reference thickness, increases the amount of power supplied by the power supply 25 of the deposition source heater 21 when the actual deposition thickness is less than the reference thickness, and reduces the amount of power supplied by the power supply 25 of the deposition source heater 21 when the actual deposition thickness is greater than the reference thickness. That is, the real-time controller 60 controls the amount of power supplied by the power supply 25 of the deposition source heater 21 in real-time.

Accordingly, measurement of vapor volume 22 of the deposition material by the deposition speed measuring sensor 30, calculation of the deposition speed by the deposition rate calculator 40, calculation of the deposition thickness by the deposition thickness calculator 50, and control of the amount of power supplied by the power supply 25 of the real-time controller 60 are performed for each substrate on which a thin film 11 is to be deposited. That is, deposition speed measurement, deposition thickness calculation, and control of the amount of power supplied by the power supply 25 of the deposition source heater 21 are performed upon a substrate is loaded into the deposition chamber, and the deposition process for forming the thin film is then performed.

Accordingly, the influence of measurement noise that may be generated by the deposition speed measuring sensor 30 may be minimized, and distribution of the deposition thickness of the organic light emitting material may be reduced.

A configuration and an operation of a device for manufacturing a display device constructed as the principle of another exemplary embodiment of the present invention will now be described.

Figure 3:
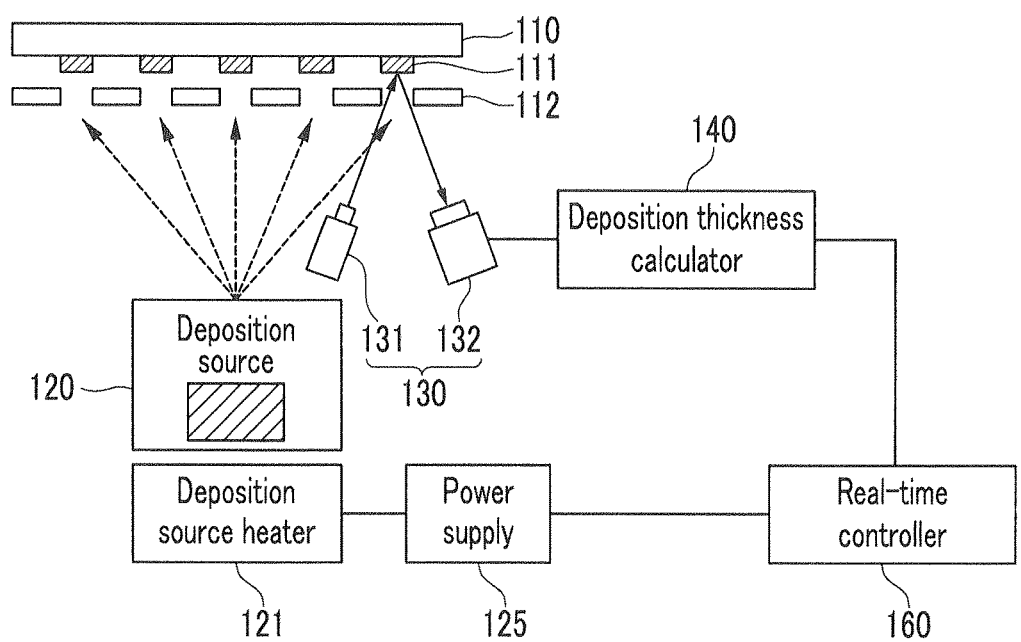
FIG. 3 is a block diagram of a device for manufacturing a display device construct as the principle of another exemplary embodiment of the present invention.
Figure 4A:
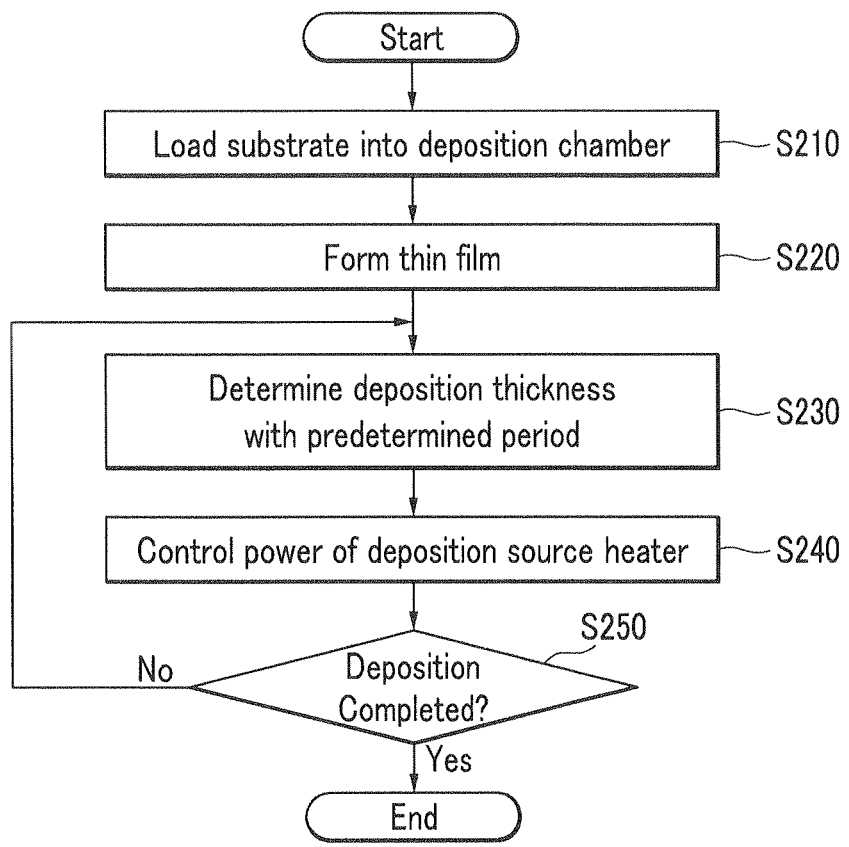
FIGS. 4A and 4B are flowcharts of methods for manufacturing a display device construct as the principle of another exemplary embodiment of the present invention.
Figure 4B:
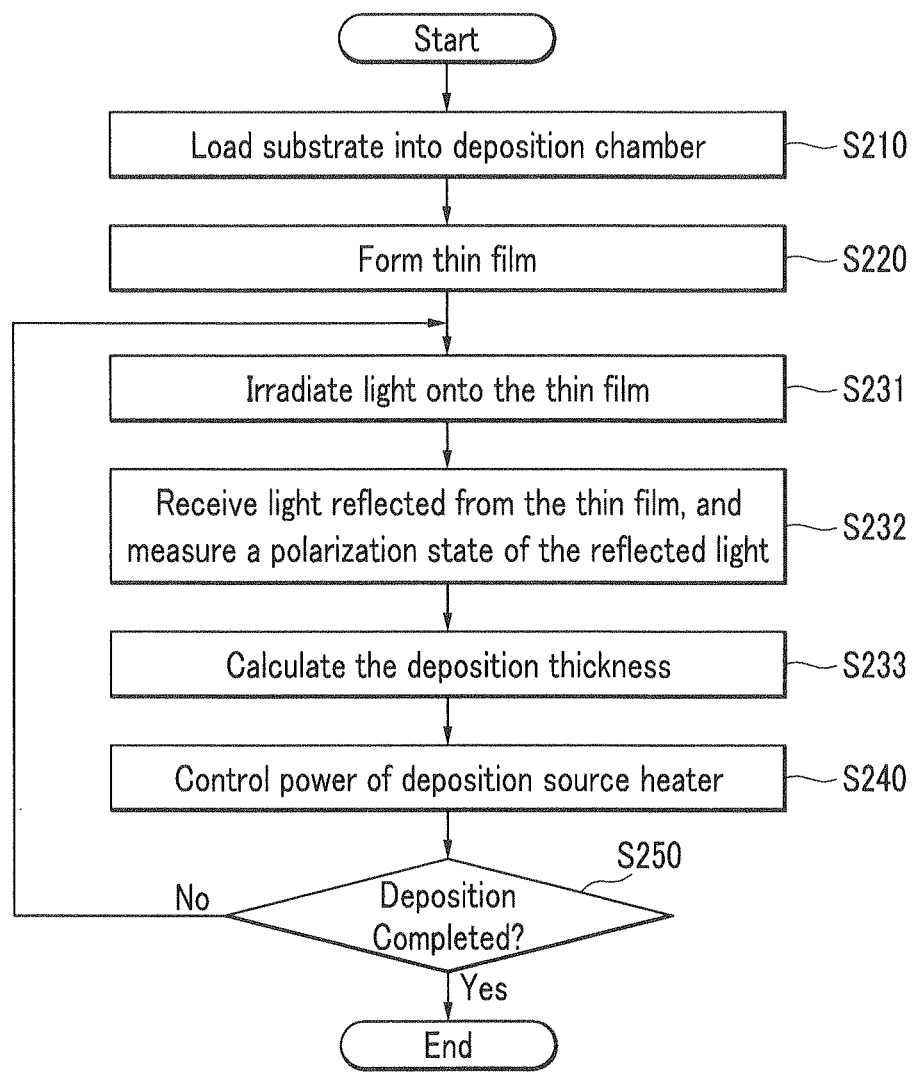

FIG. 3 is a block diagram of a device for manufacturing a display device constructed as another exemplary embodiment of the present invention, and FIGS. 4A and 4B are flowcharts of methods for manufacturing a display device constructed as another exemplary embodiment of the present invention.

Referring to FIG. 3, the device for manufacturing a display device includes a deposition source 120, a deposition thickness measurer 130, a deposition thickness calculator 140, and a real-time controller 160.

The deposition source 120 includes a deposition material, and the deposition source 120 is connected to a deposition chamber (not shown) in which the deposition process is performed. The deposition material that is formed as an organic thin film layer of an organic light emitting element includes a hole injection material, a hole transport material, a light emitting material, an electron transport material, and an electron injection material.

A deposition source heater 121 is provided near the deposition source 120, and the deposition source heater 121 is connected to a power supply 125.

The deposition thickness measurer 130 includes a photo-irradiator 131 and a photo-receiver 132 installed in the deposition chamber. The photo-irradiator 131 irradiates light onto a pattern of a thin film 111 deposited on a substrate 110, and the photo-receiver 132 receives the light reflected from a pattern of the thin film 111 and measures a polarization state of the reflected light. An ellipsometer may be used for the deposition thickness measurer 130.

The deposition thickness calculator 140 is connected to the deposition thickness measurer 130, and calculates the deposition thickness from the polarization state of the reflected light.

The real-time controller 160 is connected to the deposition thickness calculator 140, and compares the calculated deposition thickness with a reference thickness to control the amount of power supplied by the power supply 125 of the deposition source heater 121.

A method for manufacturing a display device using a device for manufacturing the above-described display device will now be described.

Referring to FIGS. 3, 4A and 4B, the substrate 110 is loaded into the deposition chamber (S210).

When the substrate 110 is loaded into the deposition chamber, the deposition material that is sublimated from the deposition source 120 passes through a mask 112 and the deposition material is deposited on the substrate 110 to form a thin film 111 (S220).

While a deposition material is deposited on the substrate 110 to form the thin film 111, the deposition thickness is measured by the deposition thickness measurer 130 at regular intervals (S230).

In one embodiment as shown in FIG. 4B, the photo-irradiator 131 irradiates light onto a random pattern of the thin film 111 for each predetermined period (S231), and the photo-receiver 132 receives the light reflected from the random pattern of the thin film 111 and measures a polarization state of the reflected light (S232). The deposition thickness calculator 140 calculates the deposition thickness by using the measured polarization state of the reflected light (S233).

In this instance, the random pattern of the thin film 111 is a measurement pattern additionally prepared for measuring the thickness of the thin film 111, and the random pattern may be a separate pattern that is deposited when the deposition material is deposited on the substrate 110.

Polarization of light reflected on the random pattern of the thin film 111 varies with the thickness of the deposited thin film 111, and the photo-receiver 132 measures the polarization state of the reflected light. The photo-receiver 132 transmits the polarization state of the reflected light to the deposition thickness calculator 140, and the deposition thickness calculator 140 calculates the deposition thickness of the deposition material from the polarization state of the reflected light. The deposition thickness calculator 140 transmits the calculated deposition thickness of the deposition material to the real-time controller 160.

The real-time controller 160 controls power of the deposition source heater 121 by comparing the calculated deposition thickness with a reference thickness (S240). The real-time controller 160 includes the reference thickness of the thin film 111. The real-time controller 160 compares the measured actual deposition thickness with the reference thickness, increases the amount of power supplied by the power supply 125 of the deposition source heater 121 when the actual deposition thickness is less than the reference thickness, and reduces the amount of power supplied by the power supply 125 of the deposition source heater 121 when the actual deposition thickness is greater than the reference thickness. When the thin film 111 is deposited on a substrate 110, the real-time controller 160 controls the amount of power supplied by the power supply 125 of the deposition source heater 121 in real-time by using the actual deposition thickness that is measured for each predetermined period during the deposition process of the thin film 111.

Accordingly, measurement of the deposition thickness by the deposition thickness measurer 130 and the deposition thickness calculator 140, and control of the amount of power supplied by the power supply 125 of the real-time controller 160, are performed for each predetermined period.

A determination (S250) is made to determine whether the deposition process of the thin film 111 is completed. If the deposition process is not completed, the steps of determining deposition thickness and controlling power of deposition source heater are repeated.

Therefore, distribution of the actual deposition thickness of the generated organic light emitting material may be reduced.

Figure 5:
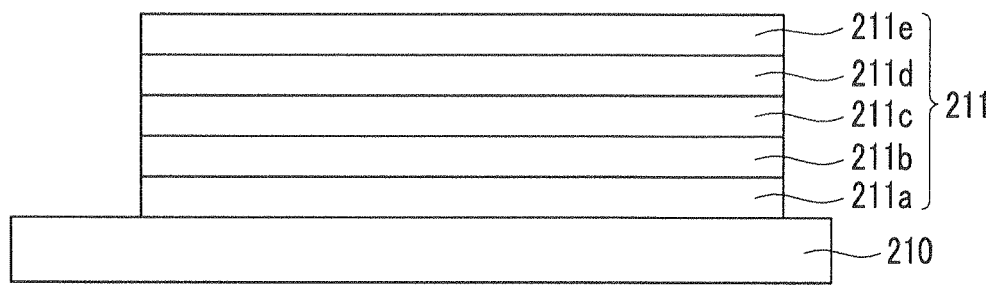
FIG. 5 is a cross-sectional view of an organic light emitting element manufactured by a device and a method for manufacturing a display device construct as the principle of an exemplary embodiment of the present invention.

FIG. 5 is a cross-sectional view of an organic light emitting element manufactured by a device for manufacturing a display device according to an exemplary embodiment of the present invention.

Referring to FIG. 5, the organic light emitting element includes an organic thin film layer 211 that is deposited on a substrate 210. The organic thin film layer 211 includes a hole injection layer (HIL) 211a, a hole transport layer 211b, an emission layer 211c, an electron transport layer 211d, and an electron injection layer (EIL) 211e that are sequentially provided on the substrate 210. The organic thin film layer 211 may be provided when a hole injection material, a hole transport material, a light emitting material, an electron transport material, and an electron injection material are sequentially deposited on the substrate 210.

An anode (not shown) may be formed below the hole injection layer (HIL) 211a, and a cathode (not shown) may be formed above the electron injection layer (EIL) 211e. The anode has a work function that is greater than that of the cathode, and is formed with a material for transmitting visible light generated by the organic thin film layer 211 to the outside. In solid state physics, the work function is the minimum energy (usually measured in electron volts) needed to remove an electron from a solid to a point immediately outside the solid surface (or the minimum energy needed to move an electron from the Fermi level into vacuum). For example, indium-tin oxide (ITO) may be used for the anode. The cathode may be made with metallic materials having high reflectance, such as gold (Au), copper (Cu), aluminum (Al), silver (Ag), indium (In), calcium (Ca), or alloys thereof.

When a driving signal for hole injection is applied to the anode, holes are emitted, and when a driving signal for electron injection is applied to the cathode, electrons are emitted. The emitted holes and electrons are combined in the organic thin film layer 211 to generate visible light. The generated visible light may be emitted outside through the anode and the substrate 210.

Figure 6A:
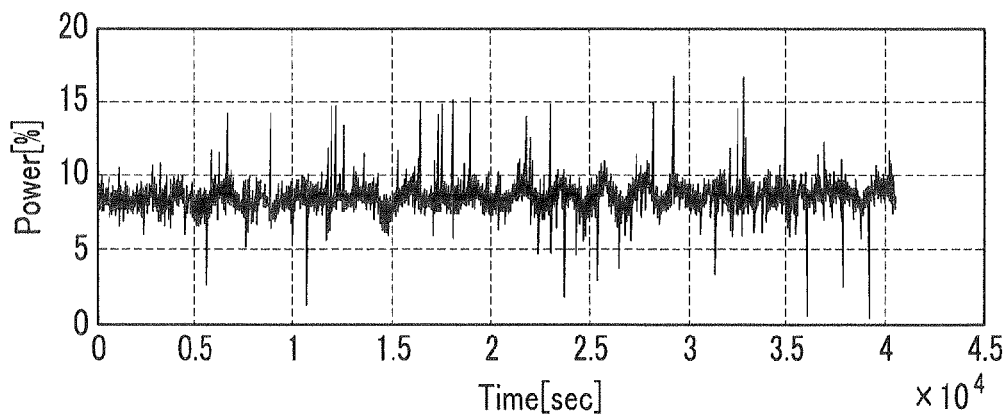
FIG. 6A is a two dimensional graph showing change of deposition source heater power as a function of time in a deposition device using a contemporary PID controller.
Figure 6B:
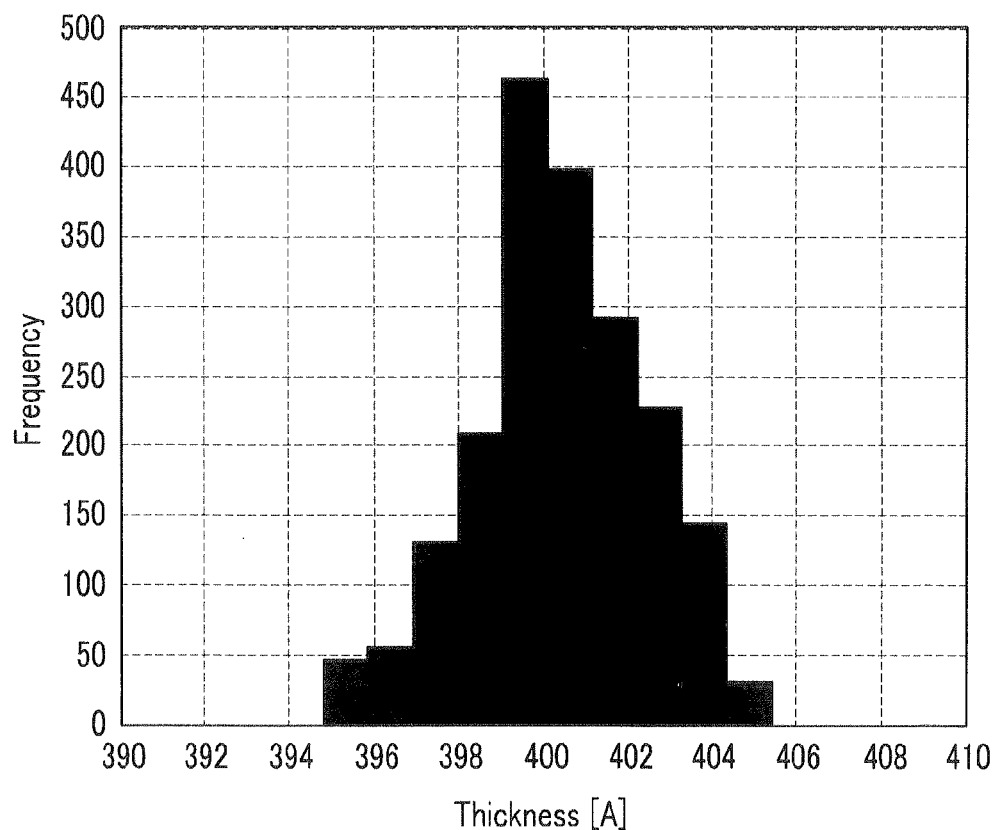
FIG. 6B is a two dimensional graph showing change of distribution of deposition thickness as a function of frequency in a deposition device using a contemporary PID controller.

FIG. 6A is a graph showing change of deposition source heater power as a function of time in a deposition device using a conventional PID controller. FIG. 6B is a graph showing change of distribution of deposition thickness as a function of frequency in a deposition device using a conventional PID controller.

Referring to FIGS. 6A and 6B, the contemporary deposition device determines the deposition speed of the deposition material by using the vapor volume 22 of the deposition material measured by the quartz crystal sensor, and controls power of the deposition source heater 21 by using the PID controller according to the deposition speed.

As shown in FIG. 6A, the power variation graph of the deposition source heater 21 shows variation of power of the deposition source heater with respect to time, wherein the horizontal axis indicates time (sec) and the vertical axis indicates power amount (%).

As shown in FIG. 6B, the distribution graph of the deposition thickness shows distribution of thickness of the thin film deposited on the substrate, the horizontal axis shows thickness (Å) of the deposited thin film, and the vertical axis shows frequency.

When the power of the deposition source heater is controlled by using the PID controller, the power variation graph of the deposition source heater shows that the power of the deposition source heater is fluctuated.

When the power of the deposition source heater is controlled by using the PID controller, the distribution graph of the deposition thickness shows distribution of the deposition thickness as 2.04 Å.

Figure 7A:
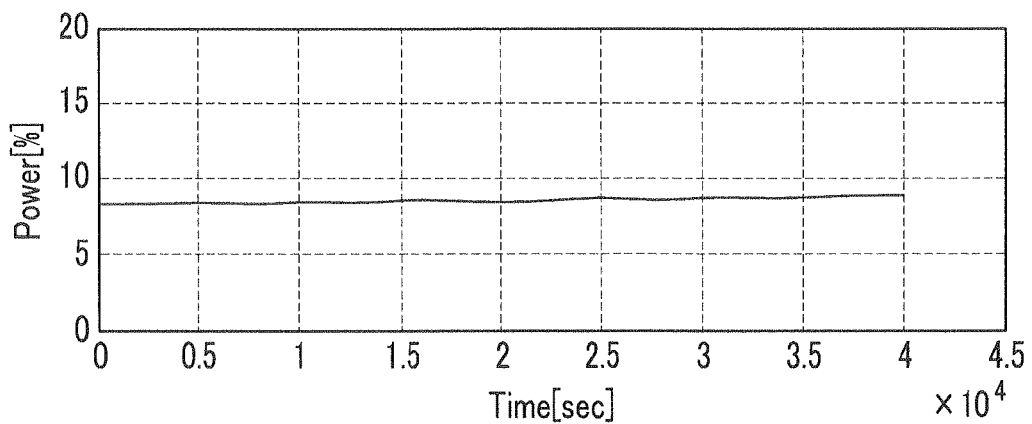
FIG. 7A is a two dimensional graph showing change of deposition source heater power as a function of time in a device for manufacturing a display device construct as an exemplary embodiment of the present invention.
Figure 7B:
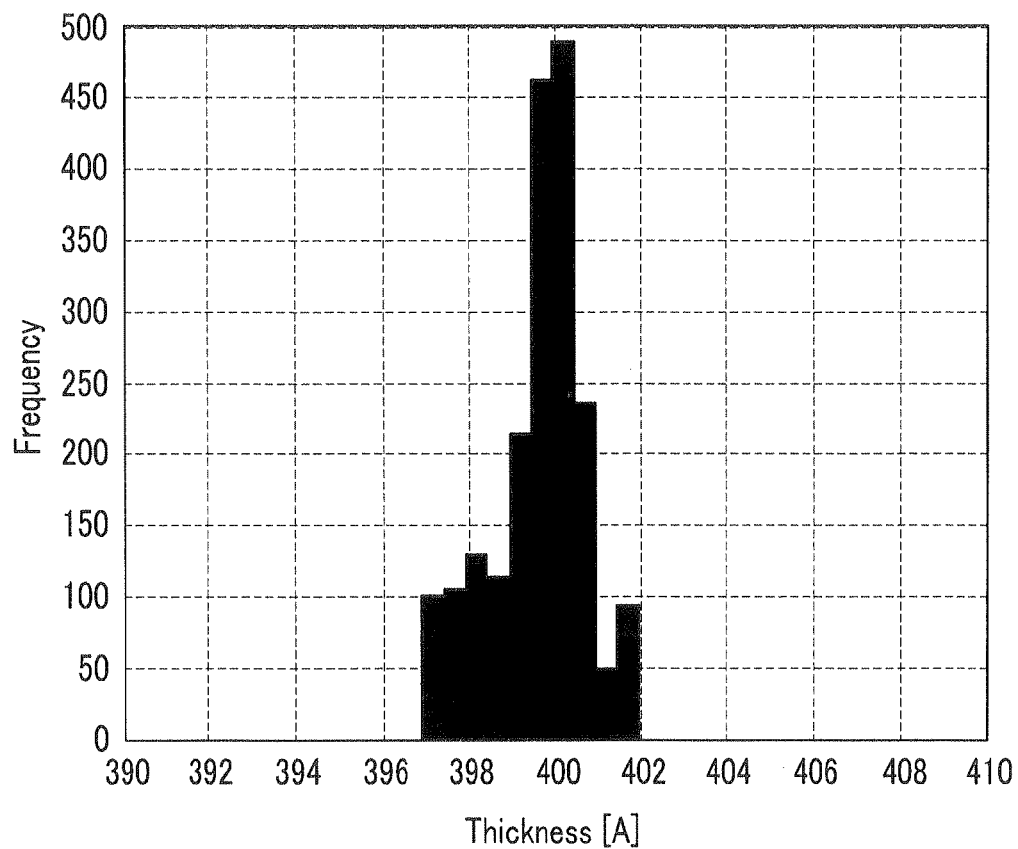
FIG. 7B is a two dimensional graph showing change of the distribution of deposition thickness as a function of frequency in a device for manufacturing a display device construct as the principle of an exemplary embodiment of the present invention.

FIG. 7A is a graph showing the change of deposition source heater power as a function of time in a device for manufacturing a display device constructed as an exemplary embodiment of the present invention. FIG. 7B is a graph showing the change of the distribution of deposition thickness as a function of frequency in a device for manufacturing a display device constructed as an exemplary embodiment of the present invention.

Referring to FIG. 7A, when power of the deposition source heater is controlled in real-time based on the deposition thickness that is calculated by integrating the deposition speed that is measured by using the device for manufacturing the display device of FIG. 1, variation of power of the deposition source heater is very much less with respect to time in the power variation graph of the deposition source heater compared to that of FIG. 6A.

Referring to FIG. 7B, the distribution graph of the deposition thickness shows that the distribution of the deposition thickness is 1.10 Å. The distribution of deposition thickness of FIG. 7B is much less compared to that of FIG. 6B.

Figure 8A:
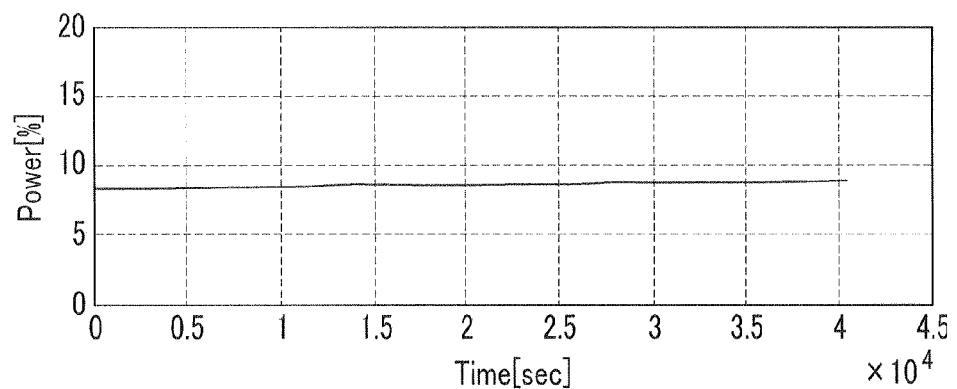
FIG. 8A is a two dimensional graph showing change of deposition source heater power as a function of time in a device for manufacturing a display device construct as the principle of another exemplary embodiment of the present invention.
Figure 8B:
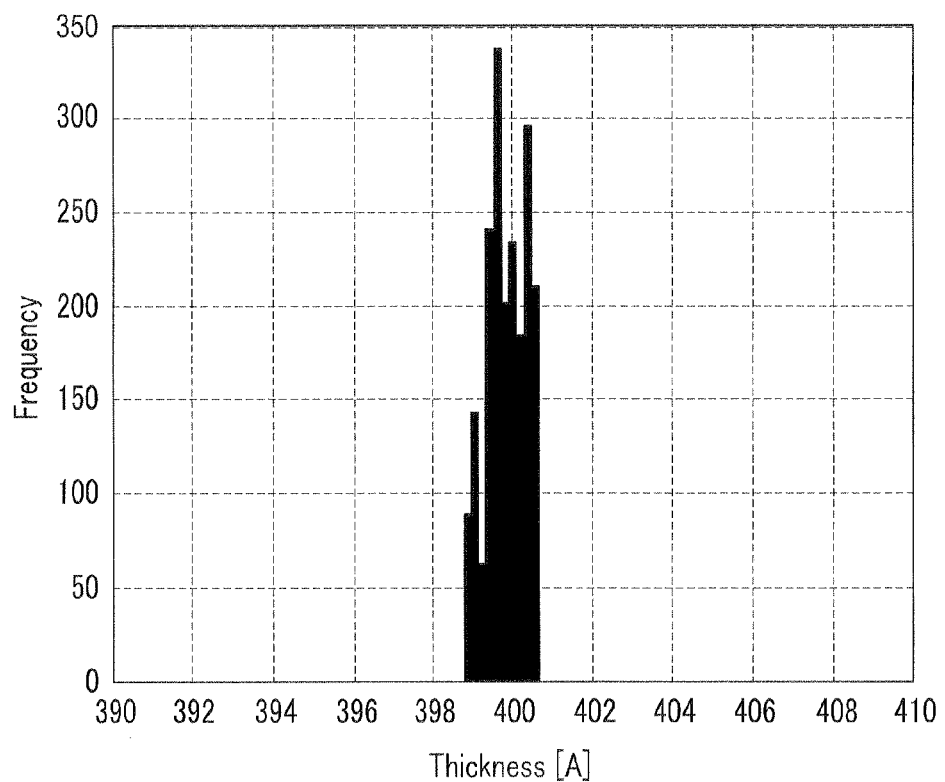
FIG. 8B is a two dimensional graph showing change of the distribution of deposition thickness as a function of frequency in a device for manufacturing a display device construct as the principle of another exemplary embodiment of the present invention.

FIG. 8A is a graph showing change of deposition source heater power as a function of time in a device for manufacturing a display device according to another exemplary embodiment of the present invention. FIG. 8B is a graph showing change of the distribution of deposition thickness as a function of frequency in a device for manufacturing a display device according to another exemplary embodiment of the present invention.

Referring to FIG. 8A, when the power of the deposition source heater is controlled in real-time based on the deposition thickness that is periodically measured by using the device for manufacturing the display device of FIG. 3, variation of power of the deposition source heater is very much less with respect to time in the power variation graph of the deposition source heater compared to that of FIG. 6A.

Referring to FIG. 8B, the distribution graph of the deposition thickness shows that the distribution of the deposition thickness is 0.50 Å. The distribution of deposition thickness of FIG. 8B is much less compared to that of FIG. 6B.

Accordingly, compared to the case of controlling the power of the deposition source heater by using the PID controller based on the contemporary deposition speed, the case of calculation/measuring the deposition thickness and controlling the power of the deposition source heater by using the real-time controller of the present invention provides a more stable power variation of the deposition source heater and shows that the distribution of the deposition thickness is much less and the actual thickness is much closer to the reference thickness compared with the contemporary case. That is, the yield of the deposition process may be increased and a higher quality display device may be produced by reducing the distribution of the deposition thickness of the organic light emitting material.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A device for manufacturing a display device, comprising:
    a deposition source;
    a deposition thickness calculator making determination of a deposition thickness of a deposition material deposited on a substrate, and the deposition material being provided by the deposition source;
    a controller controlling application of power to a heater disposed to heat the deposition source by comparing the deposition thickness determined with a reference thickness, and the controller controlling the power of the heater either once when each substrate is loaded into a deposition chamber or at regular intervals during each period while the deposition material is deposited on the substrate; and
    a deposition speed measuring sensor measuring a vapor volume of the deposition material that is sublimated from the deposition source with the deposition material filling the deposition chamber, the deposition speed measuring sensor not coexisting in the device for manufacturing the display device with a deposition thickness measurer which irradiates light to a pattern of a thin film that is deposited onto the substrate, receives the light reflected by the pattern of the thin film, and measures a polarization state of the light reflected,
    wherein the deposition speed measuring sensor comprises a quartz crystal sensor and the deposition speed measuring sensor measures the vapor volume emitted from the deposition source before contacting the substrate.

2. The device of claim 1, further including a deposition rate calculator providing a representation of a deposition speed of the deposition material by using the measured vapor volume of the deposition material.

3. The device of claim 2, wherein the deposition thickness calculator calculates the deposition thickness of the deposition material by integrating the deposition speed of the deposition material with respect to time.

* * * * *